(12) United States Patent
Sekar et al.

(10) Patent No.: US 8,772,749 B2
(45) Date of Patent: *Jul. 8, 2014

(54) BOTTOM ELECTRODES FOR USE WITH METAL OXIDE RESISTIVITY SWITCHING LAYERS

(75) Inventors: Deepak Chandra Sekar, San Jose, CA (US); Franz Kreupl, München (DE); Raghuveer S. Makala, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 235 days.

This patent is subject to a terminal disclaimer.

(21) Appl. No.: 13/047,020

(22) Filed: Mar. 14, 2011

(65) Prior Publication Data

US 2011/0227020 A1 Sep. 22, 2011

Related U.S. Application Data

(60) Provisional application No. 61/314,577, filed on Mar. 16, 2010.

(51) Int. Cl.
*H01L 47/00* (2006.01)
*H01L 45/00* (2006.01)

(52) U.S. Cl.
CPC ............................... *H01L 45/146* (2013.01)
USPC .................... 257/4; 257/E45.003; 349/51

(58) Field of Classification Search
CPC ....................................................... H01L 45/146
USPC .................. 257/4, E45.003; 349/51
See application file for complete search history.

(56) References Cited

U.S. PATENT DOCUMENTS

| | | | |
|---|---|---|---|
| 4,954,455 | A | 9/1990 | Wanderman et al. |
| 5,915,167 | A | 6/1999 | Leedy |
| 6,343,032 | B1 | 1/2002 | Black et al. |
| 6,509,601 | B1 | 1/2003 | Lee et al. |
| 6,542,000 | B1 | 4/2003 | Black et al. |
| 6,952,030 | B2 | 10/2005 | Herner et al. |
| 7,026,689 | B2 | 4/2006 | Liaw |
| 7,176,064 | B2 | 2/2007 | Herner |
| 7,251,152 | B2 | 7/2007 | Roehr |
| 7,319,053 | B2 | 1/2008 | Subramanian et al. |

(Continued)

FOREIGN PATENT DOCUMENTS

| | | |
|---|---|---|
| EP | 2 048 713 | 4/2009 |
| EP | 2 099 072 | 9/2009 |

(Continued)

OTHER PUBLICATIONS

Jul. 3, 2012 Reply to Office Action of related U.S. Appl. No. 13/047,098.

(Continued)

*Primary Examiner* — Howard Weiss
(74) *Attorney, Agent, or Firm* — Vierra Magen Marcus LLP

(57) ABSTRACT

In a first aspect, a metal-insulator-metal (MIM) stack is provided that includes (1) a first conductive layer comprising a silicon-germanium (SiGe) alloy; (2) a resistivity-switching layer comprising a metal oxide layer formed above the first conductive layer; and (3) a second conductive layer formed above the resistivity-switching layer. A memory cell may be formed from the MIM stack. Numerous other aspects are provided.

25 Claims, 12 Drawing Sheets

(56) References Cited

U.S. PATENT DOCUMENTS

| | | | |
|---|---|---|---|
| 7,532,497 B2 | 5/2009 | Kinoshita | |
| 7,629,198 B2 | 12/2009 | Kumar et al. | |
| 7,648,896 B2 | 1/2010 | Herner | |
| 7,668,002 B2 | 2/2010 | Kinoshita et al. | |
| 7,678,607 B2 | 3/2010 | Chiang et al. | |
| 7,705,343 B2 | 4/2010 | Suh et al. | |
| 7,714,313 B2 | 5/2010 | Lee et al. | |
| 7,767,499 B2 | 8/2010 | Herner | |
| 7,808,810 B2 | 10/2010 | Herner | |
| 7,812,404 B2 | 10/2010 | Herner et al. | |
| 8,179,711 B2 | 5/2012 | Kim et al. | |
| 8,354,660 B2 * | 1/2013 | Sekar et al. | 257/4 |
| 2002/0064069 A1 | 5/2002 | Goebel et al. | |
| 2005/0174861 A1 | 8/2005 | Kim et al. | |
| 2006/0250836 A1 | 11/2006 | Herner et al. | |
| 2006/0267019 A1 | 11/2006 | Kim et al. | |
| 2007/0069241 A1 | 3/2007 | Yang et al. | |
| 2007/0080382 A1 | 4/2007 | Kikuchi et al. | |
| 2007/0132049 A1 | 6/2007 | Stipe | |
| 2007/0165434 A1 | 7/2007 | Lee et al. | |
| 2007/0228414 A1 | 10/2007 | Kumar et al. | |
| 2007/0246764 A1 | 10/2007 | Herner | |
| 2008/0003793 A1 | 1/2008 | Herner et al. | |
| 2008/0070162 A1 | 3/2008 | Ufert | |
| 2008/0170428 A1 | 7/2008 | Kinoshita | |
| 2008/0210924 A1 | 9/2008 | Shin | |
| 2008/0211036 A1 | 9/2008 | Zhao et al. | |
| 2008/0278990 A1 | 11/2008 | Kumar | |
| 2008/0304308 A1 | 12/2008 | Stipe | |
| 2009/0026434 A1 | 1/2009 | Malhotra et al. | |
| 2009/0095985 A1 | 4/2009 | Lee et al. | |
| 2009/0140229 A1 | 6/2009 | Sandoval | |
| 2009/0200536 A1 | 8/2009 | Van Schaijk et al. | |
| 2009/0236581 A1 | 9/2009 | Yoshida et al. | |
| 2009/0303780 A1 | 12/2009 | Kasko et al. | |
| 2010/0038791 A1 | 2/2010 | Lee et al. | |
| 2010/0110757 A1 | 5/2010 | Ma et al. | |
| 2010/0110765 A1 | 5/2010 | Tian et al. | |
| 2010/0118590 A1 | 5/2010 | Carter et al. | |
| 2010/0129947 A1 | 5/2010 | Lee et al. | |
| 2010/0230655 A1 | 9/2010 | Noshiro | |
| 2010/0243983 A1 | 9/2010 | Chiang et al. | |
| 2010/0315857 A1 | 12/2010 | Sonehara et al. | |

FOREIGN PATENT DOCUMENTS

| | | |
|---|---|---|
| EP | 2 113 943 A2 | 11/2009 |
| WO | WO 2008/154359 | 12/2008 |
| WO | WO 2009/050861 | 4/2009 |
| WO | WO 2010/004705 | 1/2010 |
| WO | WO 2010/062309 | 6/2010 |

OTHER PUBLICATIONS

Notice of Allowance in related U.S. Appl. No. 13/047,098 mailed Sep. 10, 2012.
Communication pursuant to Rules 161(1) and 162 EPC of related European Patent Application No. 11712085.7 mailed Oct. 23, 2012.
Communication pursuant to Rules 161(1) and 162 EPC of related European Patent Application No. 11713107.8 mailed Oct. 23, 2012.
Chen et al., "Non-volatile resistive switching for advanced memory applications:" IEDM Technical Digest 2005, IEEE, 2005, pp. 746-749.
International Search Report and the Written Opinion of the International Application No. PCT/US2011/028394 dated Jul. 4, 2011.
International Search Report and the Written Opinion of the International Application No. PCT/US2011/028396 dated Jul. 5, 2011.
U.S. Appl. No. 12/904,770, filed Oct. 14, 2010.
U.S. Appl. No. 12/904,802, filed Oct. 14, 2010.
U.S. Appl. No. 12/905,047, filed Oct. 14, 2010.
U.S. Appl. No. 13/047,098, filed Mar. 14, 2011.
Roberston et al., "Fermi level pinning by defects in HfO2-metal gate stacks," Appl. Phys. Letters 91, 132912 (2007) (from 410 and 431 spec).
T-J. King, K. Saraswat, "A Low-Temperature (5 SSOOC) Silicon-Germanium MOS Thin-Film Transistor Technology for Large-Area Electronics", IEDM 1991. (from 410 ID).
Office Action of related U.S. Appl. No. 13/047,098 mailed Apr. 3, 2012.
Sekar et al., U.S. Appl. No. 13/740,766, filed Jan. 14, 2013.
Chen et al., U.S. Appl. No. 13/783,585, filed Mar. 4, 2013.
May 1, 2013 Reply to Oct. 23, 2012 Communication pursuant to Rules 161(1) and 162 EPC of related European Patent Application No. 11713107.8.
May 1, 2013 Reply to Oct. 23, 2012 Communication pursuant to Rules 161(1) and 162 EPC of related European Patent Application No. 11712085.7.
Office Action dated Dec. 10, 2013 in U.S. Appl. No. 12/904,802.
Response to Office Action filed Dec. 9, 2013 in European Patent Application No. 11770030.2.
Response to Office Action filed Dec. 20, 2013 in U.S. Appl. No. 12/904,770.
Response to Office Action filed Jan. 10, 2014 in U.S. Appl. No. 13/740,766.
Response to Office Action filed Nov. 20, 2013 in U.S. Appl. No. 12/904,802.
Office Action dated Oct. 11, 2013 in U.S. Appl. No. 13/740,766.
Office Action dated Sep. 26, 2013 in U.S. Appl. No. 12/904,770.
Office Action dated Aug. 22, 2013 in U.S. Appl. No. 12/904,802.
Final Office Action dated Jan. 22, 2014 in U.S. Appl. No. 12/904,770.
Response to Office Action filed Feb. 10, 2014 in U.S. Appl. No. 12/904,802.
Response to Office Action filed Mar. 10, 2014 in U.S. Appl. No. 12/904,802.
Final Office Action dated Mar. 21, 2014 in U.S. Appl. No. 13/740,766.
Response to Final Office Action dated Mar. 23, 2014 in U.S. Appl. No. 12/904,770.
Advisory Action dated Apr. 2, 2014 in U.S. Appl. No. 12/904,770.

* cited by examiner

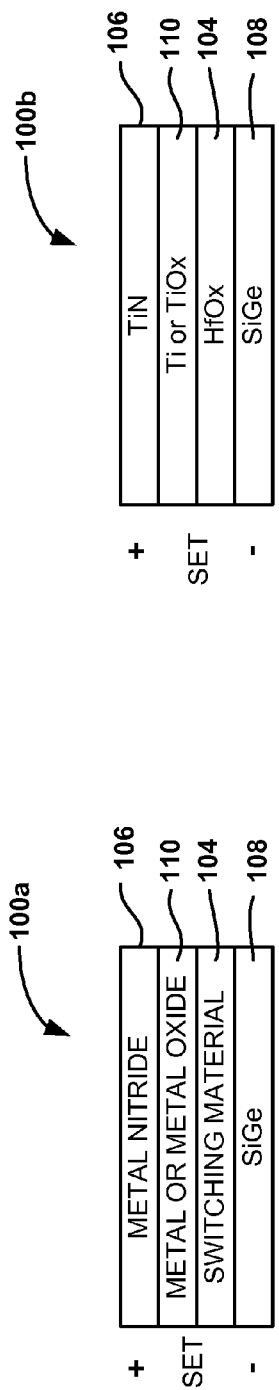
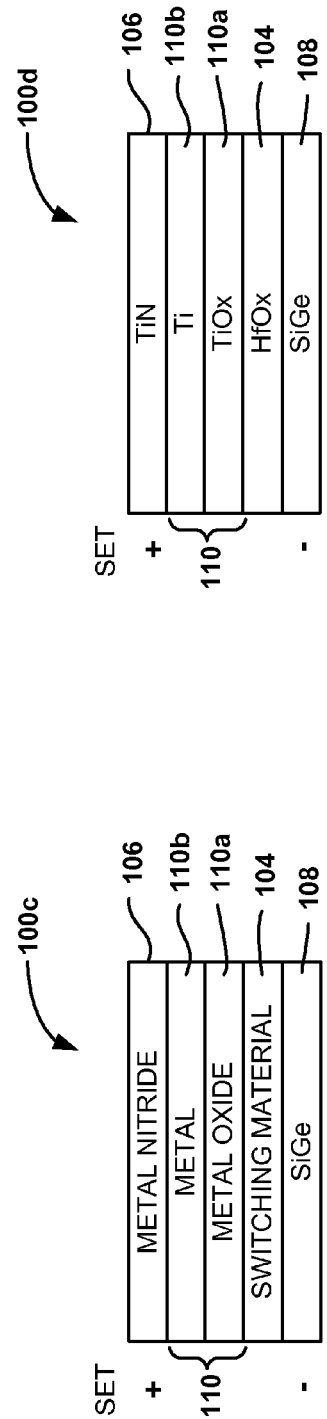

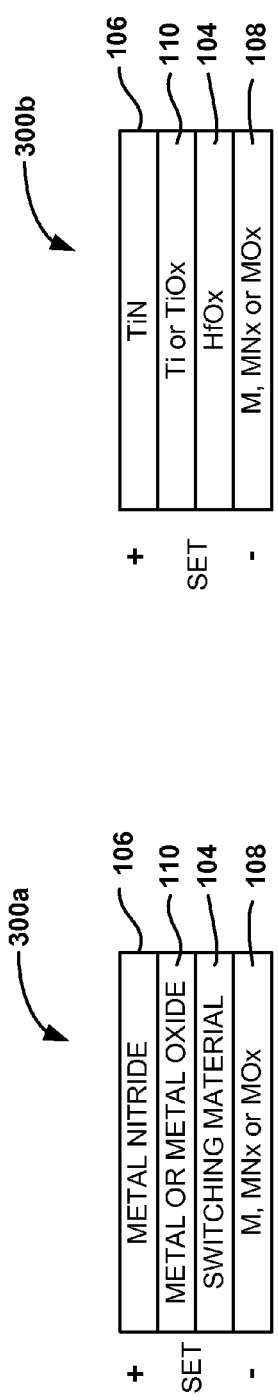
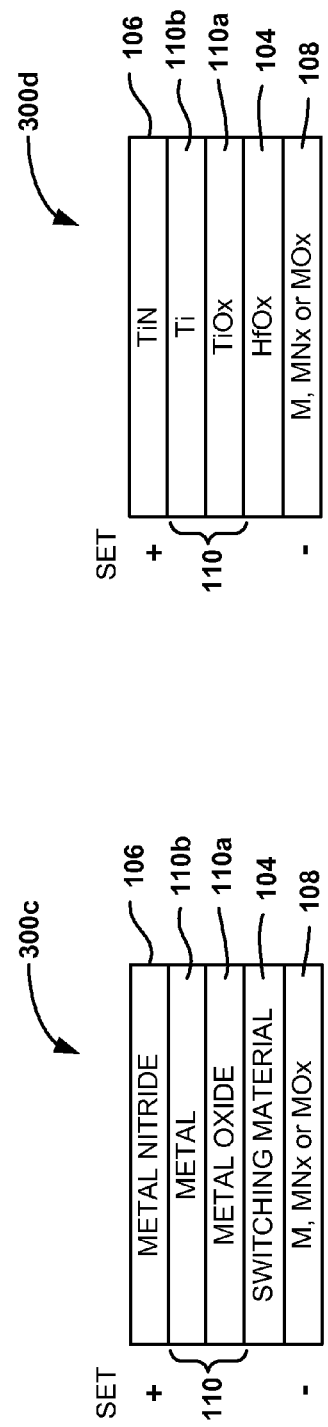

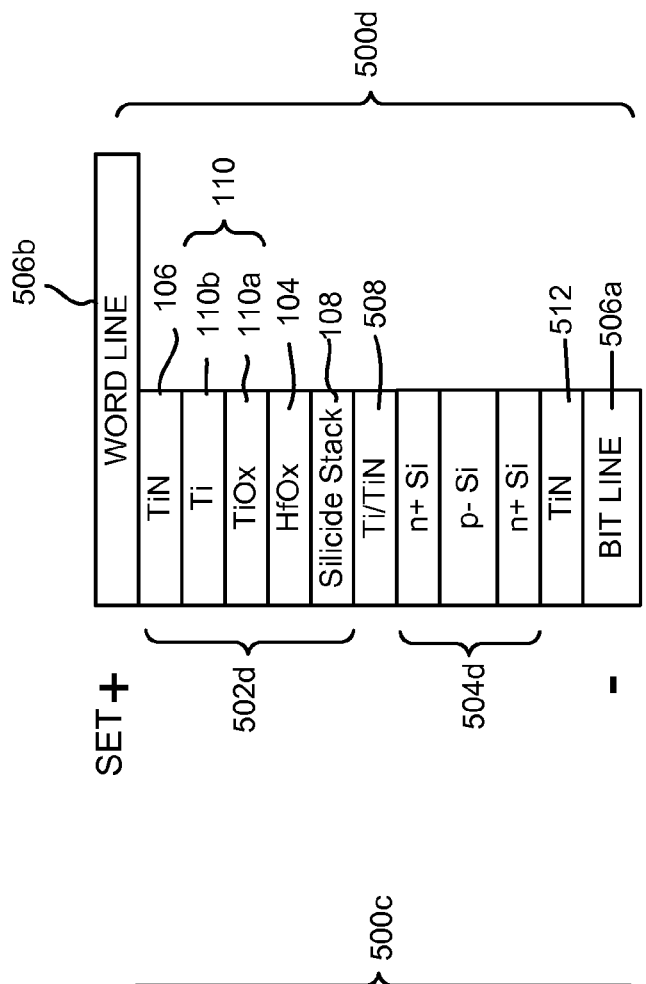
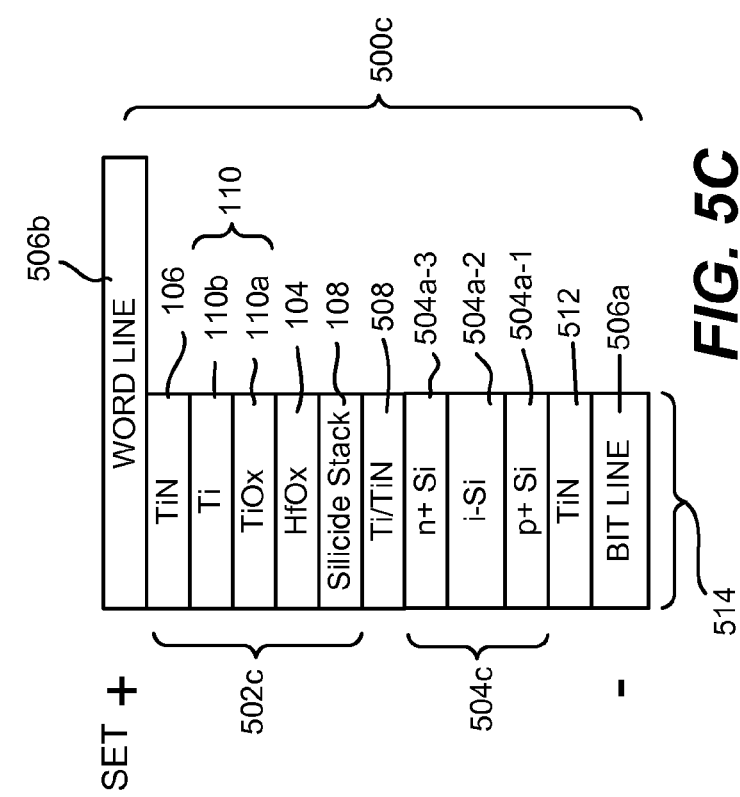
FIG. 5D
FIG. 5C

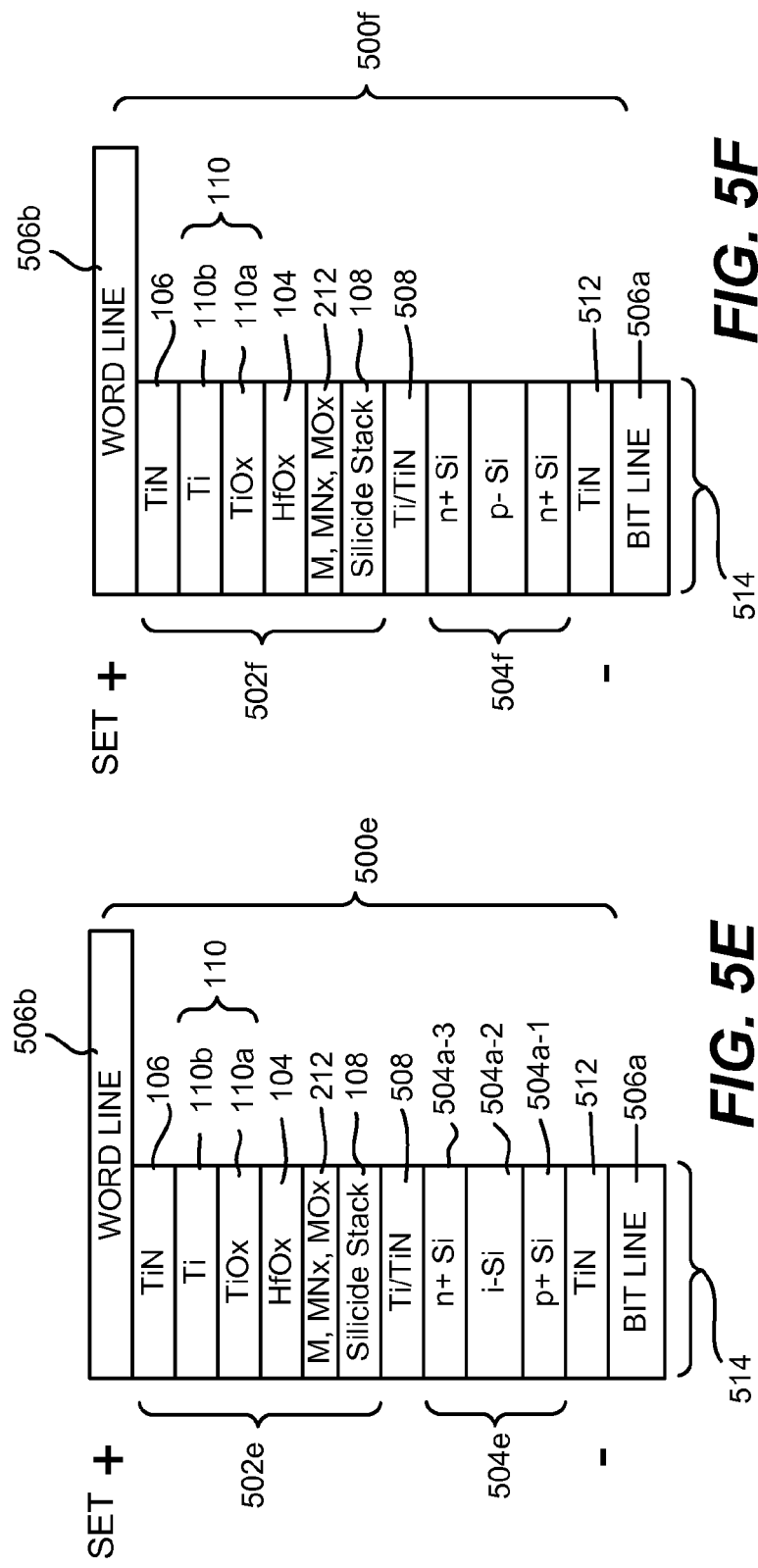

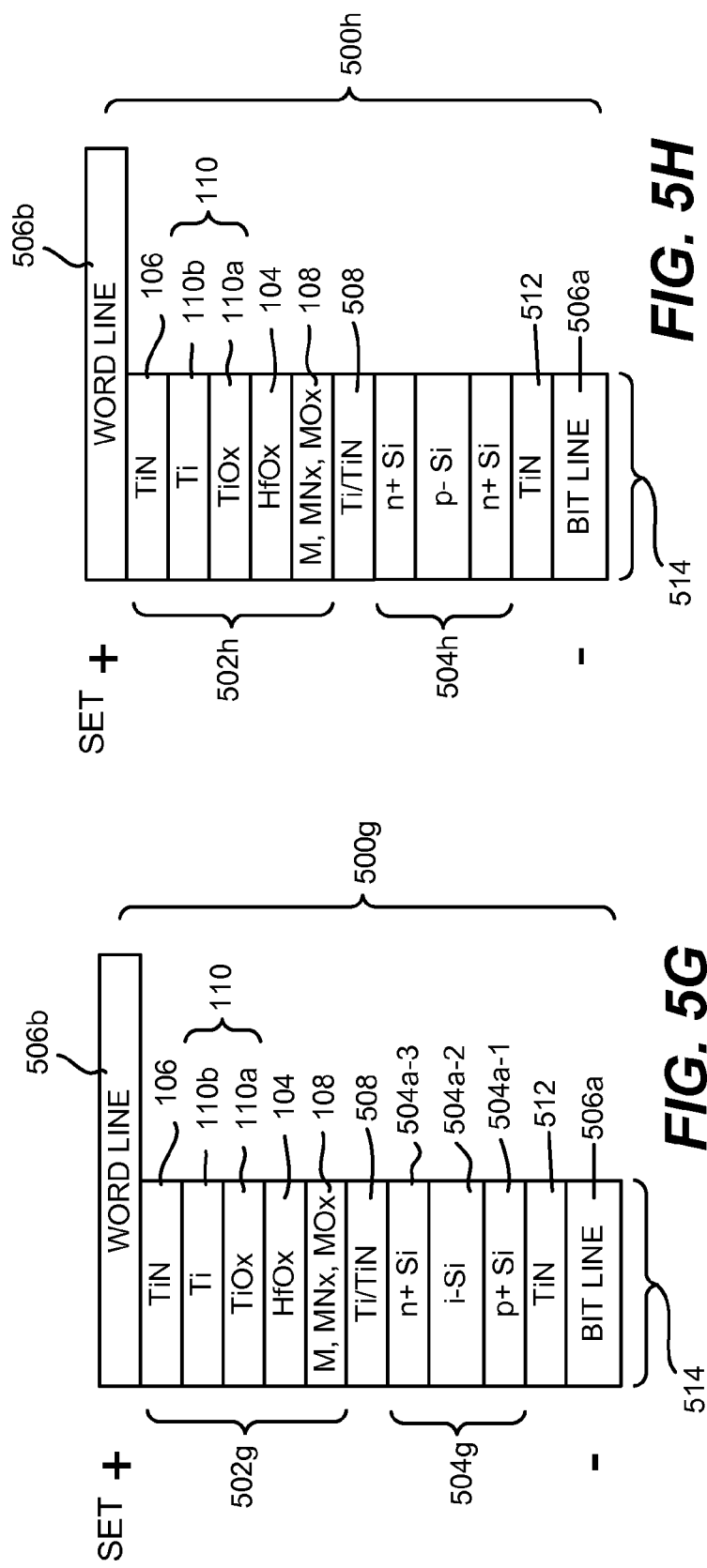

BOTTOM ELECTRODES FOR USE WITH METAL OXIDE RESISTIVITY SWITCHING LAYERS

RELATED APPLICATIONS

The present application claims priority to U.S. Provisional Patent Application Ser. No. 61/314,577, filed Mar. 16, 2010 and titled "ELECTRODES FOR USE WITH RESISTIVITY SWITCHING MATERIALS," which is hereby incorporated by reference herein in its entirety for all purposes.

FIELD OF THE INVENTION

The present invention relates to memory arrays and more particularly to bottom electrodes for use with metal oxide resistivity switching layers.

BACKGROUND OF THE INVENTION

Reversible resistivity-switching (RRS) materials such as metal oxides may be used as storage elements in memory arrays. For example, U.S. Pat. No. 7,812,404, filed May 9, 2005 and titled "NON-VOLATILE MEMORY CELL COMPRISING A DIODE AND A RESISTANCE-SWITCHING MATERIAL," which is hereby incorporated by reference herein in its entirety, describes a rewriteable non-volatile memory cell that includes a diode coupled in series with an RRS material such as a metal oxide or metal nitride.

However, fabricating memory devices from metal oxide rewriteable resistivity-switching materials with desirable switching characteristics is difficult; and improved memory devices that employ metal oxide resistivity-switching materials are desirable.

SUMMARY OF THE INVENTION

In a first aspect of the invention, a metal-insulator-metal (MIM) stack is provided that includes (1) a first conductive layer comprising a silicon-germanium (SiGe) alloy; (2) a resistivity-switching layer comprising a metal oxide layer formed above the first conductive layer; and (3) a second conductive layer formed above the resistivity-switching layer. A memory cell may be formed from the MIM stack.

In a second aspect of the invention, a method of forming an MIM stack is provided that includes (1) forming a first conductive layer comprising a SiGe alloy; (2) forming a resistivity-switching layer comprising a metal oxide layer above the first conductive layer; and (3) forming a second conductive layer above the resistivity-switching layer.

In a third aspect of the invention, a method of forming a memory cell is provided that includes (1) forming an MIM stack having (a) a first conductive layer comprising a SiGe alloy; (b) a resistivity-switching layer comprising a metal oxide layer formed above the first conductive layer; and (c) a second conductive layer formed above the resistivity-switching layer; and (2) forming a steering element coupled to the MIM stack.

In a fourth aspect of the invention, an MIM stack is provided that includes (1) a first conductive layer comprising a first metal-silicide layer and a second metal-silicide layer; (2) a resistivity-switching layer comprising a metal oxide layer formed above the first conductive layer; and (3) a second conductive layer formed above the resistivity-switching layer. A memory cell may be formed from the MIM stack.

In a fifth aspect of the invention, a method of forming an MIM stack includes (1) forming a first conductive layer comprising a first metal-silicide layer and a second metal-silicide layer; (2) forming a resistivity-switching layer comprising a metal oxide layer above the first conductive layer; and (3) forming a second conductive layer above the resistivity-switching layer. A memory cell may be formed using the method.

In a sixth aspect of the invention, an MIM is provided that includes (1) a first metal-silicide layer formed at a first temperature; (2) a second metal-silicide layer formed above the first metal-silicide layer and at a second temperature that is greater than the first temperature; (3) an n+ silicon or SiGe layer formed above the second metal-silicide layer; (4) a resistivity-switching layer comprising a metal oxide layer formed above the n+ silicon or SiGe layer; and (5) a second conductive layer formed above the resistivity-switching layer. A memory cell may be formed from the MIM stack.

In a seventh aspect of the invention, a method of forming an MIM stack includes (1) forming a first metal-silicide layer at a first temperature; (2) forming a second metal-silicide layer above the first metal-silicide layer at a second temperature that is greater than the first temperature; (3) forming an n+ silicon or SiGe layer above the second metal-silicide layer; (4) forming a resistivity-switching layer comprising a metal oxide layer above the n+ silicon or SiGe layer; and (5) forming a second conductive layer above the resistivity-switching layer. A memory cell may be formed using the method.

In an eighth aspect of the invention, an MIM stack is provided that includes (1) a first conductive layer comprising one or more of chromium, chromium nitride, hafnium, hafnium nitride, niobium, niobium nitride, vanadium, vanadium nitride, zirconium or zirconium nitride; (2) a resistivity-switching layer comprising a metal oxide layer formed above the first conductive layer; and (3) a second conductive layer formed above the resistivity-switching layer. A memory cell may be formed from the MIM stack.

In a ninth aspect of the invention, a method of forming an MIM stack is provided that includes (1) forming a first conductive layer comprising one or more of chromium, chromium nitride, hafnium, hafnium nitride, niobium, niobium nitride, vanadium, vanadium nitride, zirconium or zirconium nitride; (2) forming a resistivity-switching layer comprising a metal oxide layer above the first conductive layer; and (3) forming a second conductive layer above the resistivity-switching layer. A memory cell may be formed using the method. Numerous other aspects are provided.

Other features and aspects of this invention will become more fully apparent from the following detailed description, the appended claims and the accompanying drawings.

BRIEF DESCRIPTION OF THE DRAWINGS

FIGS. 1A-1D are cross-sectional views of first exemplary metal-insulator-metal (MIM) stacks provided in accordance with the present invention.

FIGS. 3A-3D are cross-sectional views of third exemplary MIM stacks provided in accordance with the present invention.

FIGS. 5A-5H are cross sectional views of exemplary memory cell stacks provided in accordance with the present invention.

DETAILED DESCRIPTION

Figure 2A:
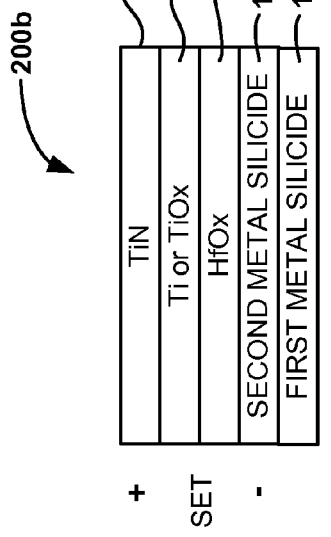
FIGS. 2A-2H are cross-sectional views of second exemplary MIM stacks provided in accordance with the present invention.

A metal-insulator-metal (MIM) stack formed from a reversible resistivity switching (RRS) material sandwiched between two metal or otherwise conducting layers may serve as a resistance-switching element for a memory cell. The two conducting layers may serve as the top and bottom electrodes of the resistance-switching element, and may be used to apply an electric field across the RRS material that changes the resistivity of the RRS material from a high value to a low value and vice versa.

In accordance with embodiments of the present invention, novel MIM stacks are provided that employ metal oxide resistivity-switching layers. Methods of forming such MIM stacks, as well as methods of employing such MIM stacks in three-dimensional (3D) memory arrays, are also provided.

These and other embodiments of the invention are described below with reference to FIGS. 1A-5H. For example, FIGS. 1A-1D illustrate MIM stacks that employ SiGe bottom electrodes. FIGS. 2A-2H illustrate MIM stacks that employ multi-layer metal-silicide bottom electrodes. FIGS. 3A-3D illustrate MIM stacks that employ bottom electrodes with metal, metal nitrides or metal oxides specifically selected to promote oxygen vacancy formation in metal oxide switching layers. FIGS. 4A-5H illustrate exemplary embodiments of memory cells and memory arrays that may use any of the above described MIM stacks and/or bottom electrodes.

MIM Stacks with SiGe Bottom Electrodes

In accordance with some embodiments of the invention, MIM stacks are provided that employ bottom electrodes comprised of a silicon germanium alloy. For example, FIG. 1A illustrates an MIM stack 100a that includes a reversible resistivity switching (RRS) material 104 sandwiched between a top electrode 106 and a SiGe bottom electrode 108. One or more additional layers 110 such as a metal layer, a metal oxide layer, a metal/metal oxide layer stack, or the like, may be employed within the MIM stack 100a as described further below.

The RRS material 104 may include, for example, $HfO_X$, $ZrO_X$, $NiO_X$, $TiO_X$, $TaO_X$, $NbO_X$, $Al_XO_Y$, another metal oxide ($MO_X$) layer, any combination of these metal oxides, or another suitable switching material. In some embodiments, the top electrode 106 may include titanium nitride, tantalum nitride, tungsten nitride, combinations of the same, a metal/metal nitride stack such as Ti/TiN, Ta/TaN, W/WN or another similar layer. In other embodiments, the top electrode 106 may include heavily doped semiconductor such as n+ silicon or p+ silicon, heavily doped germanium, or heavily doped silicon-germanium. Other materials and/or configurations may be used for the top electrode 106.

Use of an n+ Si bottom electrode may improve the switching characteristics of a metal oxide such as $HfO_2$ by effectively lowering the free energy for forming oxygen vacancies within the metal oxide. Typically, such an n+ Si electrode is formed by depositing an amorphous or polysilicon n+ Si layer and then annealing the n+ Si layer to improve its crystallinity and surface properties prior to formation of a metal oxide layer over the n+ Si layer. Such an anneal is generally achieved via a rapid thermal anneal (RTA) at a temperature of about 750° C. However, when forming a multi layer, 3 dimensional memory array, use of such a high RTA temperature for each memory layer may exceed the thermal budget of the memory array.

In accordance with some embodiments of the present invention, the bottom electrode of an MIM stack may include a layer of SiGe alloy having, for example, between about 5 to about 35 atm % Ge and an n+ doping concentration of about $5 \times 10^{19}$-$5 \times 10^{21}$ atoms/cm$^3$, in some embodiments about $2 \times 10^{20}$ atoms/cm$^3$. Such a SiGe alloy layer may be formed at a substantially lower temperature than a polycrystalline n+ Si bottom electrode layer as the presence of Ge lowers the crystallization temperature. For example, in some embodiments, a polycrystalline SiGe alloy layer may be deposited at a temperature of about 600° C. or lower, and in some embodiments, about 550° C. or lower without requiring an additional high temperature anneal to improve crystallinity of the SiGe layer (depending on the atm % of Ge employed). Alternatively, an amorphous SiGe alloy layer be deposited at a lower deposition temperature and crystallized using an RTA of about 600° C. or less, and in some embodiments, about 550° C. or less (depending on the atm % of Ge employed).

In particular embodiments, SiGe bottom electrodes with about 5-35 atm % Ge significantly reduce deposition and/or crystallization anneal temperatures while still providing ample Si for oxygen vacancy formation within metal oxide switching layers. Exemplary thicknesses for the SiGe bottom electrode 108 range from about 2 to 100 nanometers. Other atm % of Ge, doping types, doping levels, annealing temperatures and/or layer thicknesses may be used.

In some embodiments, the additional layer(s) 110 may include, for example, titanium, titanium oxide, tantalum, tantalum oxide, tungsten, tungsten oxide, etc. In yet other embodiments, the additional layer(s) 110 may include a metal/metal oxide layer stack such as $Ti/TiO_X$, $Zr/ZrO_X$, $Ni/NiO_X$, $Al/Al_XO_Y$, $Ta/TaO_X$, $Nb/NbO_X$, $Hf/HfO_X$, or any suitable layer stack.

FIG. 1B illustrates a particular exemplary embodiment of the MIM stack 100a of FIG. 1A, referred to as MIM stack 100b in FIG. 1B. In the MIM stack 100b of FIG. 1B, the bottom electrode 108 is a SiGe alloy, the RRS material 104 is hafnium oxide, the top electrode 106 is titanium nitride, and a titanium or titanium oxide layer is provided as a buffer layer between the hafnium oxide switching material (RRS material 104) and the TiN top electrode 106. For example, the bottom electrode 108 (SiGe) may have a thickness of about 2 to 100 nanometers, in other embodiments about 10-60 nanometers, and in some embodiments about 20 nanometers. The Ti or $TiO_X$ layer 110 may have a thickness of about 0.5-10 nanometers, and in some embodiments about 2 nanometers. When $TiO_X$ is employed, x may be about 1.2-2, and in some embodiments about 1.5. The hafnium oxide layer 104 may have a thickness of about 3-12 nanometers, and in some embodiments about 5 nanometers, with x being about 1.2-2.0 and in some embodiments about 1.7. The TiN top electrode 106 may have a thickness of about 2 to 100 nanometers, in other embodiments about 10-60 nanometers, and in some embodiments about 20 nanometers. The doping concentration of the n+ SiGe bottom electrode 108 may be about $5\times10^{19}$-$5\times10^{21}$ atoms/cm$^3$ and in some embodiments about $2\times10^{20}$ atoms/cm$^3$ with about 5-35 atm % Ge. Other film thicknesses, x values, atm % of Ge and/or doping concentrations may be used.

FIG. 1C illustrates a cross-sectional view of another exemplary MIM stack 100c having a SiGe bottom electrode 108, RRS material 104 formed above the SiGe bottom electrode 108, a metal/metal oxide layer stack 110 including metal oxide layer 110a and metal layer 110b formed above the RRS material 104, and a top metal nitride electrode 106 formed above the metal/metal oxide layer stack 110.

In general, the top electrode 106 may include, for example, titanium nitride, tantalum nitride, tungsten nitride, combinations of the same, a metal/metal nitride stack such as Ti/TiN, Ta/TaN, W/WN or another similar barrier layer. The metal/metal oxide layer stack 110 may include, for example, Ti/TiO$_X$, Zr/ZrO$_X$, Ni/NiO$_X$, Al/Al$_X$O$_Y$, Ta/TaO$_X$, Nb/NbO$_X$, Hf/HfO$_X$ or another similar layer stack. The RRS material 104 may include, for example, HfO$_X$, ZrO$_X$, NiO$_X$, TiO$_X$, TaO$_X$, NbO$_X$ or Al$_X$O$_Y$, any combination of these metal oxides, or another suitable switching material.

In some embodiments, the metal/metal-oxide layer stack 110 may be formed from a different material than is employed for the RRS material 104. For example, a Ti/TiO$_X$ layer stack may be employed with a HfO$_X$, ZrO$_X$, NiO$_X$, TaO$_X$, NbO$_X$ or Al$_X$O$_Y$ switching material. A Zr/ZrO$_X$ layer stack may be used with a HfO$_X$, NiO$_X$, TiO$_X$, TaO$_X$, NbO$_X$ or Al$_X$O$_Y$ switching material. A Ni/NiO$_X$ layer stack may be used with a HfO$_X$, ZrO$_X$, TiO$_X$, TaO$_X$, NbO$_X$ or Al$_X$O$_Y$ switching material. An Al/Al$_X$O$_Y$ layer stack may be employed with a HfO$_X$, ZrO$_X$, NiO$_X$, TiO$_X$, TaO$_X$, or NbO$_X$ switching material. A Ta/TaO$_X$ layer stack may be employed with a HfO$_X$, TiO$_X$, ZrO$_X$, NiO$_X$, NbO$_X$ or Al$_X$O$_Y$ switching material. A Nb/NbO$_X$ layer stack may be employed with a HfO$_X$, TiO$_X$, ZrO$_X$, NiO$_X$, TaO$_X$ or Al$_X$O$_Y$ switching material. A Hf/HfO$_X$ layer stack may be employed with a NbO$_X$, TiO$_X$, ZrO$_X$, NiO$_X$, TaO$_X$ or Al$_X$O$_Y$ switching material.

In other embodiments, the metal/metal oxide layer stack 110 may be formed from a similar material to that employed for the RRS material 104. For example, a Ti/TiO$_X$ layer stack may be employed with a TiO$_X$ switching layer. However, in such embodiments, the metal oxide of the layer stack may have a different crystalline structure or other property compared to that of the switching material (e.g., amorphous versus crystalline structure). The metal oxide layer of the metal/metal-oxide layer stack 110 may serve as a "buffer" layer that allows formation/elimination of oxygen vacancies within the switching material to be more controllable and/or repeatable, which may improve the endurance/longevity of the switching material 104.

FIG. 1D illustrates a particular exemplary embodiment of the MIM stack 100c, referred to as MIM stack 100d in FIG. 1D, in which the top electrode 106 is titanium nitride, the metal/metal oxide layer stack 110 is titanium over titanium oxide, the RRS material 104 is hafnium oxide and the bottom electrode 108 is n+ SiGe. For example, the top electrode 106 (TiN) may have a thickness of about 10-60 nanometers, and in some embodiments about 20 nanometers. The Ti layer 110b may have a thickness of about 0.5-10 nanometers, and in some embodiments about 2 nanometers. The TiO$_X$ layer 110a may have a thickness of about 0.5-6 nanometers, and in some embodiments about 1 nanometer; and x may be about 1.2-2.0 and in some embodiments about 1.5. The hafnium oxide layer 104 may have a thickness of about 3-12 nanometers, and in some embodiments about 5 nanometers; and x may be about 1.2-2 and in some embodiments about 1.7. The n+ SiGe layer 108 may have a thickness of about 10-100 nanometers, and in some embodiments about 20 nanometers. The doping concentration of the n+ SiGe layer 106 may be about $5\times10^{19}$-$5\times10^{21}$ atoms/cm$^3$ and in some embodiments about $2\times10^{20}$ atoms/cm$^3$ with about 5-35 atm % Ge. Other film thicknesses, x values, atm % of Ge and/or doping concentrations may be used.

MIM Stacks with Multi-Layer Silicide Bottom Electrodes

In accordance with some embodiments of the invention, MIM stacks are provided that employ bottom electrodes comprised of a two or more silicide layers. For example, FIG. 2A illustrates an MIM stack 200a that includes an RRS material 104 sandwiched between a top electrode 106 and a bottom electrode 108 that includes a first metal-silicide layer 108a and a second metal-silicide layer 108b. One or more additional layers 110 such as a metal layer, a metal oxide layer, a metal/metal oxide layer stack, or the like, may be employed within the MIM stack 200a as described further below.

The RRS material 104 may include, for example, HfO$_X$, ZrO$_X$, NiO$_X$, TiO$_X$, TaO$_X$, NbO$_X$, Al$_X$O$_Y$, another metal oxide (MO$_X$) layer, or another suitable switching material. In some embodiments, the top electrode 106 may include titanium nitride, tantalum nitride, tungsten nitride, combinations of the same, a metal/metal nitride stack such as Ti/TiN, Ta/TaN, W/WN or another similar layer. In other embodiments, the top electrode 106 may include heavily doped semiconductor such as n+ silicon or p+ silicon, heavily doped germanium, or heavily doped silicon-germanium. Other materials and/or configurations may be used for the top electrode 106.

As stated, use of an n+ Si bottom electrode may improve the switching characteristics of a metal oxide such as HfO$_2$ by effectively lowering the free energy for forming oxygen vacancies within the metal oxide. However, use of an n+ Si electrode typically requires a relatively high temperature anneal (e.g., about 750° C.) to improve crystallinity and surface properties of the n+ Si electrode prior to formation of a metal oxide layer over the n+ Si layer. When forming a multi layer, 3 dimensional memory array, use of such a high temperature anneal for each memory layer may exceed the thermal budget of the memory array.

In accordance with embodiments of the present invention, the bottom electrode 108 may include two or more layers of metal silicide. In some embodiments, one or more of such metal silicide layers may be formed at temperatures lower than 750° C., such as 600° C. or less, and in some embodiments, about 500-550° C. or less, depending on the type of silicide employed. For example, cobalt silicide typically may be formed at temperatures of about 300-800° C. and nickel silicide typically may be formed at temperatures of about 400-800° C., depending on factors such as the ratio of Co or Ni atoms to Si atoms. Titanium silicide and tungsten silicide typically require higher formation temperatures ranging from about 500-900° C. for titanium silicide and about 1000° C. or more for tungsten silicide. In any case, use of metal silicides may still provide ample Si for oxygen vacancy formation.

Exemplary materials that may be used for the first metal-silicide layer 108a and/or the second metal-silicide layer 108b include titanium silicide, tantalum silicide, tungsten silicide, nickel silicide, cobalt silicide or molybdenum silicide, although other metal-silicides may be used. In some embodiments, the lower (first) metal-silicide layer 108a may be formed at a lower temperature than the upper (second) metal-silicide layer 108b. In such instances, the lower metal-silicide layer 108a may serve as a crystallization seed layer or "template" for the upper metal-silicide layer 108b, allowing the upper metal-silicide layer 108b to be formed at a lower temperature. For instance, the first metal-silicide layer 108a may include nickel silicide or cobalt silicide while the second metal-silicide layer 108b may include titanium silicide. Alternatively, the first metal-silicide layer 108a may include titanium silicide and the second metal-silicide layer 108b may include tungsten silicide. Other combinations of silicide layers may be used.

Exemplary thicknesses for the first and/or second metal-silicide layers 108a and 108b range from about 2 to about 50 nanometers. Other thicknesses may be used for either or both layers. While two metal-silicide layers are shown in FIG. 2A, it will be understood that more than two metal-silicide layers may be employed (e.g., 3, 4, 5, etc.).

In some embodiments, the additional layer(s) 110 may include, for example, titanium, titanium oxide, tantalum, tantalum oxide, tungsten, tungsten oxide, etc. In yet other embodiments, the additional layer(s) 110 may include a metal/metal oxide layer stack such as $Ti/TiO_X$, $Zr/ZrO_X$, $Ni/NiO_X$, $Al/Al_XO_Y$, $Ta/TaO_X$, $Nb/NbO_X$, $Hf/HfO_X$, or any suitable layer stack.

Figure 2B:
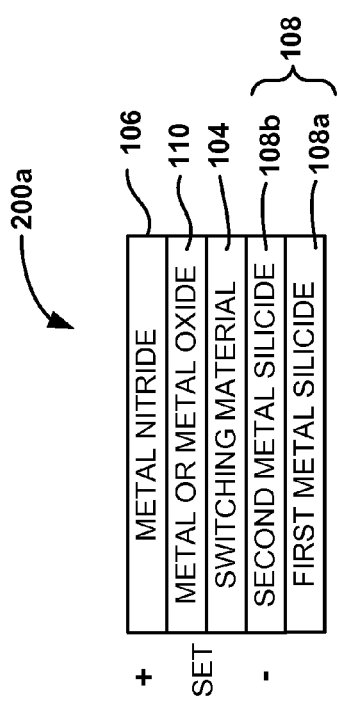

FIG. 2B illustrates a particular exemplary embodiment of the MIM stack 200a of FIG. 2A, referred to as MIM stack 200b in FIG. 2B. In the MIM stack 200b of FIG. 2B, the bottom electrode 108 is a multi-layer metal-silicide stack, the RRS material 104 is hafnium oxide, the top electrode 106 is titanium nitride, and a titanium or titanium oxide layer is provided as a buffer layer between the hafnium oxide switching material (RRS material 104) and the TiN top electrode 106. As an example, each metal-silicide layer 108a or 108b of the bottom electrode 108 may have a thickness of about 2 to 50 nanometers, in other embodiments about 5-25 nanometers, and in some embodiments about 20 nanometers. The Ti or $TiO_X$ layer 110 may have a thickness of about 0.5-10 nanometers, and in some embodiments about 2 nanometers. When $TiO_X$ is employed, x may be about 1.2-2, and in some embodiments about 1.5. The hafnium oxide layer 104 may have a thickness of about 3-12 nanometers, and in some embodiments about 5 nanometers, with x being about 1.2-2.0 and in some embodiments about 1.7. The TiN top electrode 106 may have a thickness of about 2 to 100 nanometers, in other embodiments about 10-60 nanometers, and in some embodiments about 20 nanometers. Other film thicknesses, x values and/or doping concentrations may be used.

Figure 2C:
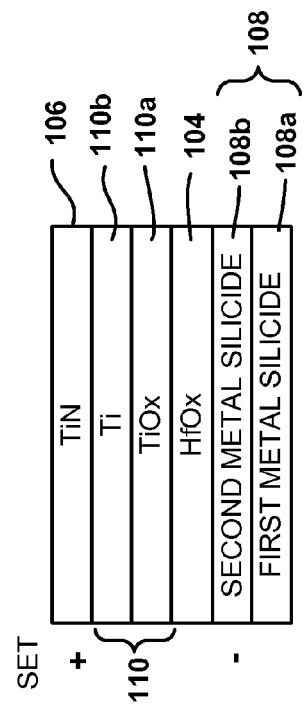

FIG. 2C illustrates a cross-sectional view of another exemplary MIM stack 200c having a multi-layer silicide bottom electrode 108, RRS material 104 formed above the bottom electrode 108, a metal/metal oxide layer stack 110 including metal oxide layer 110a and metal layer 110b formed above the RRS material 104, and a top metal nitride electrode 106 formed above the metal/metal oxide layer stack 110.

In general, the top electrode 106 may include, for example, titanium nitride, tantalum nitride, tungsten nitride, combinations of the same, a metal/metal nitride stack such as Ti/TiN, Ta/TaN, W/WN or another similar barrier layer. The metal/metal oxide layer stack 110 may include, for example, $Ti/TiO_X$, $Zr/ZrO_X$, $Ni/NiO_X$, $Al/Al_XO_Y$, $Ta/TaO_X$, $Nb/NbO_X$, $Hf/HfO_X$ or another similar layer stack. The RRS material 104 may include, for example, $HfO_X$, $ZrO_X$, $NiO_X$, $TiO_X$, $TaO_X$, $NbO_X$ or $Al_XO_Y$ or another suitable switching material.

In some embodiments, the metal/metal-oxide layer stack 110 may be formed from a different material than is employed for the RRS material 104. For example, a $Ti/TiO_X$ layer stack may be employed with a $HfO_X$, $ZrO_X$, $NiO_X$, $TaO_X$, $NbO_X$ or $Al_XO_Y$ switching material. A $Zr/ZrO_X$ layer stack may be used with a $HfO_X$, $NiO_X$, $TiO_X$, $TaO_X$, $NbO_X$ or $Al_XO_Y$ switching material. A $Ni/NiO_X$ layer stack may be used with a $HfO_X$, $ZrO_X$, $TiO_X$, $TaO_X$, $NbO_X$ or $Al_XO_Y$ switching material. An $Al/Al_XO_Y$ layer stack may be employed with a $HfO_X$, $ZrO_X$, $NiO_X$, $TiO_X$, $TaO_X$, or $NbO_X$ switching material. A $Ta/TaO_X$ layer stack may be employed with a $HfO_X$, $TiO_X$, $ZrO_X$, $NiO_X$, $NbO_X$ or $Al_XO_Y$ switching material. A $Nb/NbO_X$ layer stack may be employed with a $HfO_X$, $TiO_X$, $ZrO_X$, $NiO_X$, $TaO_X$ or $Al_XO_Y$ switching material. A $Hf/HfO_X$ layer stack may be employed with a $NbO_X$, $TiO_X$, $ZrO_X$, $NiO_X$, $TaO_X$ or $Al_XO_Y$ switching material.

In other embodiments, the metal/metal oxide layer stack 110 may be formed from a similar material to that employed for the RRS material 104. For example, a $Ti/TiO_X$ layer stack may be employed with a $TiO_X$ switching layer. However, in such embodiments, the metal oxide of the layer stack may have a different crystalline structure or other property compared to that of the switching material (e.g., amorphous versus crystalline structure).

Figure 2D:
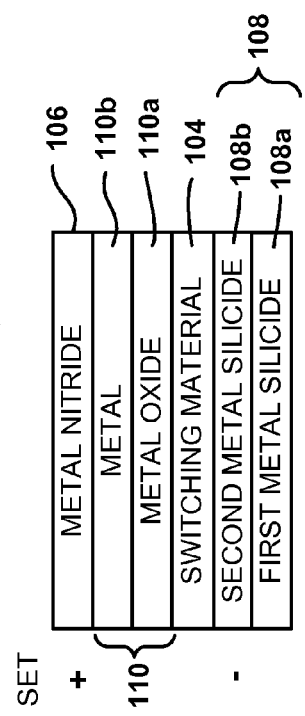

FIG. 2D illustrates a particular exemplary embodiment of the MIM stack 200c, referred to as MIM stack 200d in FIG. 2D, in which the top electrode 106 is titanium nitride, the metal/metal oxide layer stack 110 is titanium over titanium oxide, the RRS material 104 is hafnium oxide and the bottom electrode 108 is a multi-layer metal-silicide stack. For example, the top electrode 106 (TiN) may have a thickness of about 10-60 nanometers, and in some embodiments about 20 nanometers. The Ti layer 110b may have a thickness of about 0.5-10 nanometers, and in some embodiments about 2 nanometers. The $TiO_X$ layer 110a may have a thickness of about 0.5-6 nanometers, and in some embodiments about 1 nanometer; and x may be about 1.2-2.0 and in some embodiments about 1.5. The hafnium oxide layer 104 may have a thickness of about 3-12 nanometers, and in some embodiments about 5 nanometers; and x may be about 1.2-2 and in some embodiments about 1.7. Each metal-silicide layer 108a or 108b may have a thickness of about 2-50 nanometers, and in some embodiments about 25 nanometers. Other film thicknesses, x values and/or doping concentrations may be used.

Figure 2F:
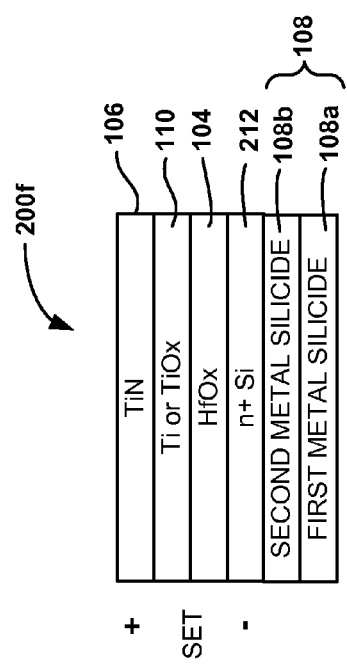
Figure 2H:
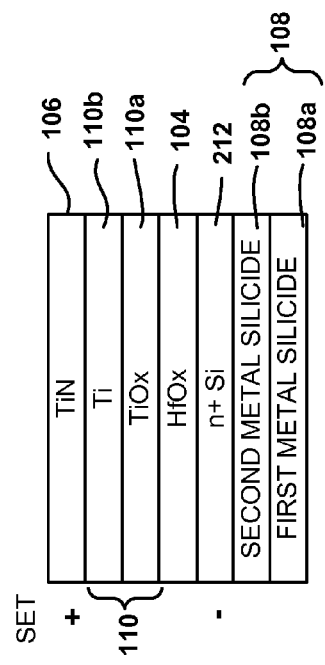
Figure 2E:
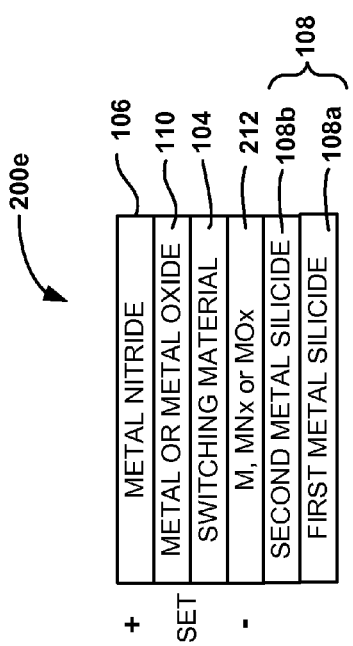

FIG. 2E illustrates an alternative exemplary embodiment of the MIM stack 200a of FIG. 2A, referred to as MIM stack 200e in FIG. 2E. The MIM stack 200e of FIG. 2E is similar to the MIM stack 200a of FIG. 2A, but includes an additional metal (M), metal nitride ($MN_X$) or metal oxide ($MO_X$) layer 212 positioned between the RRS material 104 and the multi-layer metal-silicide layer stack 108 (and that may form part of the bottom electrode 108). In some embodiments, the metal, metal nitride or metal oxide layer 212 may include one or more of silicon, silicon nitride or oxide, aluminum, aluminum nitride or oxide, lanthanum, lanthanum nitride or oxide, molybdenum, molybdenum nitride or oxide, tantalum, tantalum nitride or oxide, chromium, chromium nitride or oxide, hafnium, hafnium nitride or oxide, niobium, niobium nitride or oxide, vanadium, vanadium nitride or oxide, zirconium, or zirconium nitride or oxide. In other embodiments an alloy such as n+ SiGe may be used as the metal, metal nitride or metal oxide layer 212. Other materials may also be employed.

Certain metals may promote oxygen vacancy formation in metal oxides by making oxygen vacancy formation more energetically favorable, effectively reducing the Gibbs free energy of forming oxygen vacancies within the metal oxides. See, for example, Roberston et al., "Fermi level pinning by defects in $HfO_2$-metal gate stacks," Appl. Phys. Letters 91, 132912 (2007), which describes oxygen vacancy formation in a $HfO_2$ gate oxide/Si channel system.

In some embodiments of the present invention, the additional metal, metal nitride or metal oxide layer 212 may be selected so as to have a Gibbs free energy of formation per 0 between about −3 and −6 eV so as to promote oxygen vacancy formation within the metal oxide RRS material 104. Exemplary metals that may be suitable include, for example, Yb, Tb, Y, So, La, Hf, Mg, Zr, Ta, Nb, V, Zn, W, Mo, Ti, Al, Cr, Si, Ni, Re, Co, Cu, Ru, Rh, Pd, and Ir. Metal nitrides (or metal oxides) of these metals may render oxygen vacancy formation energetically more favorable within resistivity-switching metal oxides. Accordingly, in some embodiments, the additional metal, metal nitride or metal oxide layer 212 may be formed from one or more metals, metal nitrides or metal oxides of the above-listed materials, or any other materials having a Gibbs free energy of formation per 0 between about −3 and −6 eV.

Exemplary thicknesses for the metal, metal nitride or metal oxide layer 212 may range from about 10 to about 100 angstroms. Other thicknesses may be used.

Figure 2G:
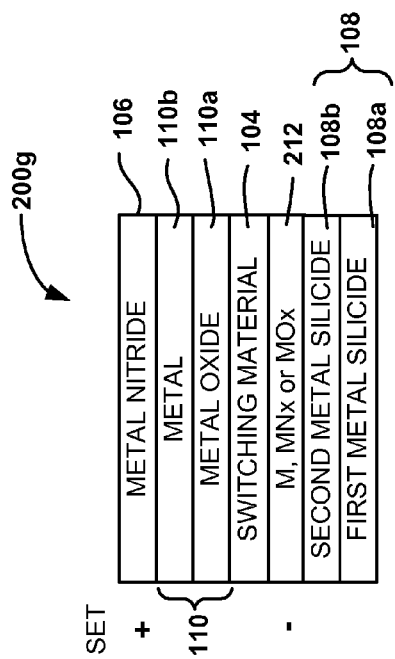

FIGS. 2F-2H illustrate MIM stacks 200f-200h that are similar to the MIM stacks 200b-200d of FIGS. 2B-2D, but include the metal, metal nitride or metal oxide layer 212.

Additional MIM Stack Embodiments

FIGS. 3A-3D illustrates alternative embodiments of the MIM stacks 200e-200h of FIGS. 2E-2H, referred to as MIM stacks 300a-d in FIGS. 3A-3D, in which a metal, metal nitride or metal oxide layer such as the metal, metal nitride or metal oxide layer 212 is used as the bottom electrode 108 without the first and second metal-silicide layers 108a and 108b. In some embodiments, the metal, metal nitride or metal oxide bottom electrode 108 may include one or more of silicon, silicon nitride or oxide, aluminum, aluminum nitride or oxide, lanthanum, lanthanum nitride or oxide, molybdenum, molybdenum nitride or oxide, tantalum, tantalum nitride or oxide, chromium, chromium nitride or oxide, hafnium, hafnium nitride or oxide, niobium, niobium nitride or oxide, vanadium, vanadium nitride or oxide, zirconium or zirconium nitride or oxide. Other materials may also be employed.

As described above, the metal, metal nitride or metal oxide bottom electrode 108 may be selected to promote oxygen vacancy formation in the metal oxide switching layer 104. For example, the metal, metal nitride or metal oxide bottom electrode 108 may be selected so as to have a Gibbs free energy of formation per 0 between about −3 and −6 eV. Exemplary metals that may fall within this range include, for example, Yb, Tb, Y, So, La, Hf, Mg, Zr, Ta, Nb, V, Zn, W, Mo, Ti, Al, Cr, Si, Ni, Re, Co, Cu, Ru, Rh, Pd, and Ir. Metal nitrides (or metal oxides) of these metals may similarly render oxygen vacancy formation more energetically favorable within resistivity-switching metal oxides. Accordingly, in some embodiments, the metal, metal nitride or metal oxide bottom electrode 108 may be formed from one or more metals, metal nitrides or metal oxides of the above-listed materials, or any other materials having a Gibbs free energy of formation per 0 between about −3 and −6 eV.

Exemplary thicknesses for the metal, metal nitride or metal oxide bottom electrode 108 may range from about 10 to about 100 angstroms. Other thicknesses may be used. In one particular embodiment, the metal, metal nitride or metal oxide bottom electrode 108 may include chromium, chromium nitride, hafnium, hafnium nitride, niobium, niobium nitride, vanadium, vanadium nitride, zirconium or zirconium nitride.

Exemplary Inventive Memory Cell

Figure 4A:
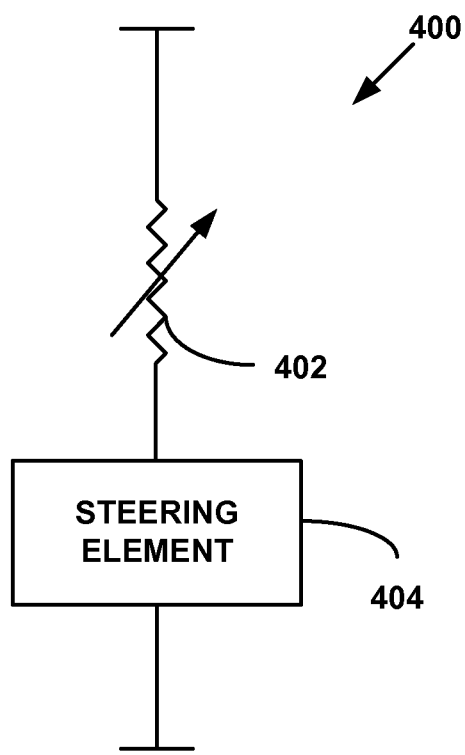
FIG. 4A is a schematic illustration of an exemplary memory cell in accordance with this invention.

FIG. 4A is a schematic illustration of an exemplary memory cell 400 in accordance with this invention. Memory cell 400 includes MIM stack 402 coupled to a steering element 404. MIM stack 402 includes RRS material 104 (not separately shown) which has a resistivity that may be reversibly switched between two or more states, and may be similar to any of the MIM stacks described previously with reference to FIGS. 1A-3D.

Steering element 404 may include a thin film transistor, a diode, a metal-insulator-metal tunneling current device, a punch-through diode, a Schottky-diode or another similar steering element that exhibits non-ohmic conduction by selectively limiting the voltage across and/or the current flow through MIM stack 402. In this manner, memory cell 400 may be used as part of a two or three dimensional memory array and data may be written to and/or read from memory cell 400 without affecting the state of other memory cells in the array. In some embodiments, steering element 404 may be omitted, and memory cell 400 may be used with a remotely located steering element.

Exemplary Embodiments of Memory Cells and Memory Arrays

Figure 4B:
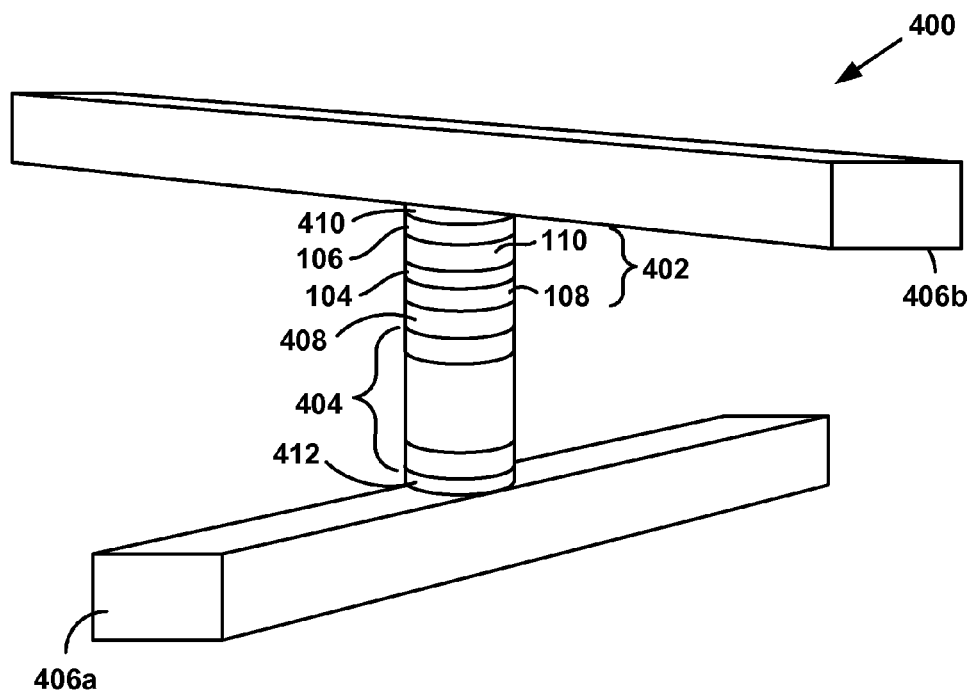
FIG. 4B is a simplified perspective view of another exemplary embodiment of a memory cell in accordance with this invention.

FIG. 4B is a simplified perspective view of an exemplary embodiment of memory cell 400 in accordance with this invention in which steering element 404 is a diode. Memory cell 400 includes MIM stack 402 (having RRS material 104) coupled in series with diode 404 between a first conductor 406a and a second conductor 406b.

As described above with reference to FIGS. 1A-3D, MIM stack 402 may serve as a reversible resistance-switching element for the memory cell 400. The MIM stack 402 may be similar to any of MIM stacks of FIGS. 1A-3D, or any other suitable MIM stack, and may include a top conducting layer 106 and a bottom conducting layer 108 that surround RRS material 104 and serve as top and bottom electrodes for the MIM stack 402. One or more additional layers 110 such as a metal layer, a metal oxide layer, a metal/metal oxide layer stack, or the like, may be employed within the MIM stack 402 as described previously.

In some embodiments, a barrier layer 408 may be formed between MIM stack 402 and diode 404, and a barrier layer 410 may be formed between MIM stack 402 and second conductor 406b. An additional barrier layer 412 may be formed between diode 404 and first conductor 406a. Barrier layers 408, 410 and 412 may include titanium, titanium nitride, tantalum, tantalum nitride, tungsten, tungsten nitride, molybdenum, combinations of the same, or another similar barrier layer. Barrier layer 210 may be separate from or part of second conductor 406b and barrier layer 412 may be separate from or part of first conductor 406a.

Diode 404 may include any suitable diode such as a vertical polycrystalline p-n or p-i-n diode, whether upward pointing with an n-region above a p-region of the diode or downward pointing with a p-region above an n-region of the diode, a p-n-p or n-p-n punch through diode, a Schottky diode or the like. Exemplary embodiments of diode 204 are described below with reference to FIGS. 5A-5H.

Figure 4C:
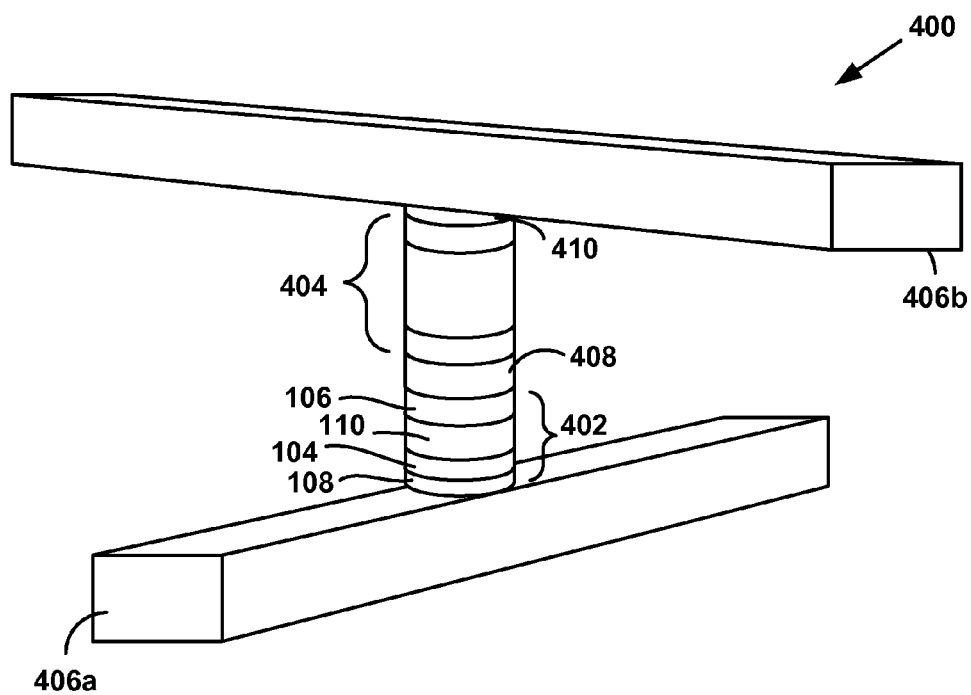
FIG. 4C is a simplified perspective view of yet another exemplary embodiment of a memory cell in accordance with this invention.

In the embodiment of FIG. 4B, the MIM stack 402 is positioned above diode 404. However, as shown in FIG. 4C, the MIM stack 402 alternatively may be positioned below the diode 404.

First conductor 406a and/or second conductor 406b may include any suitable conductive material such as tungsten, any appropriate metal, heavily doped semiconductor material, a conductive silicide, a conductive silicide-germanide, a conductive germanide, a highly conductive carbon or the like. In the embodiment of FIG. 4B, first and second conductors 406a and 406b, respectively, are line or rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first conductor 406a and/or second conductor 406b to improve device performance and/or aid in device fabrication.

Figure 4D:
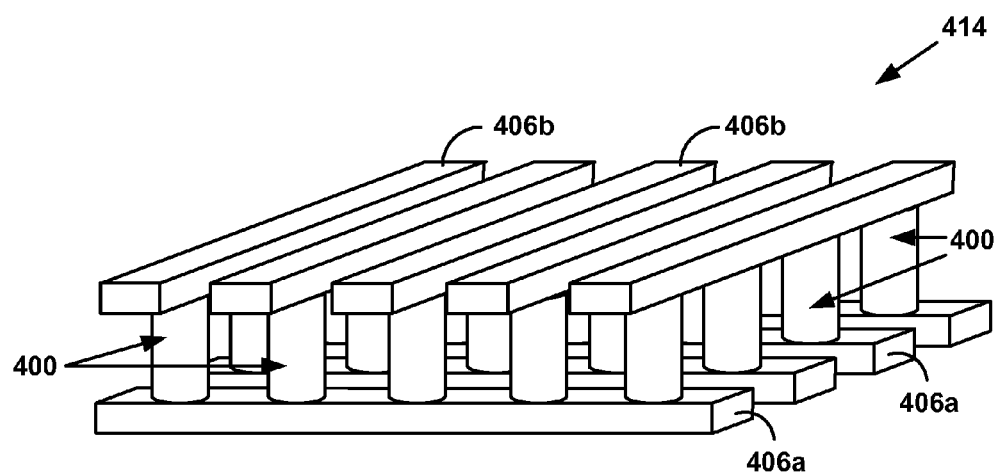
FIG. 4D is a simplified perspective view of a portion of a first memory level formed from a plurality of memory cells in accordance with this invention.

FIG. 4D is a simplified perspective view of a portion of a first memory level 414 formed from a plurality of memory cells 400, such as memory cells 400 of FIG. 4A or 4B. For simplicity, RRS material 104, conductive layers 106 and 108, additional layer(s) 110, diode 404, and barrier layers 408, 410 and 412 are not separately shown. Memory array 414 is a "cross-point" array including a plurality of bit lines (second conductors 406b) and word lines (first conductors 406a) to which multiple memory cells are coupled (as shown). Other memory array configurations may be used, as may multiple levels of memory.

Figure 4E:
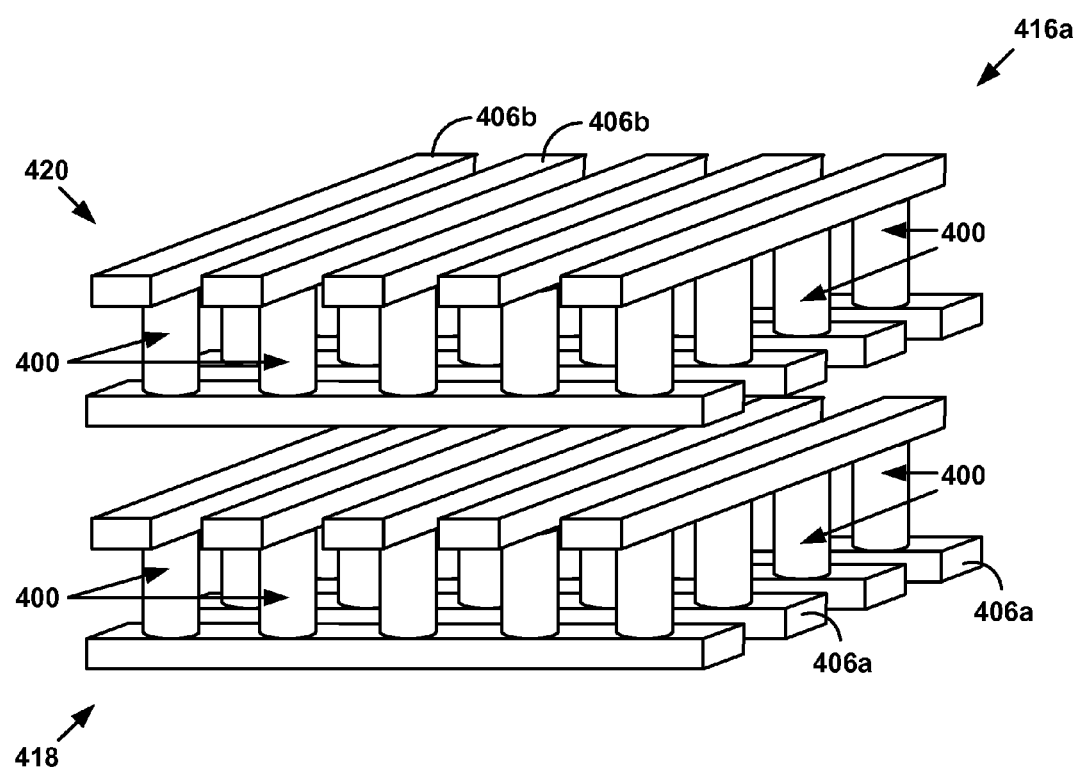
FIG. 4E is a simplified perspective view of a portion of a first monolithic three dimensional memory array that includes a first memory level positioned below a second memory level in accordance with the present invention.

FIG. 4E is a simplified perspective view of a portion of a monolithic three dimensional memory array 416a that includes a first memory level 418 positioned below a second memory level 420. Memory levels 418 and 420 each include a plurality of memory cells 400 in a cross-point array. Persons of ordinary skill in the art will understand that additional layers (e.g., an interlevel dielectric) may be present between first and second memory levels 418 and 420, but are not shown in FIG. 4E for simplicity. Other memory array configurations may be used, as may additional levels of memory.

In the embodiment of FIG. 4E, when a bipolar steering element such as a p-i-n diode is employed within each memory cell 400, all diodes may "point" in the same direction (have the same "steering element" polarity orientation), such as upward or downward depending on whether p-i-n diodes having a p-doped region on the bottom or top of the diodes are employed, simplifying diode fabrication.

Figure 4F:
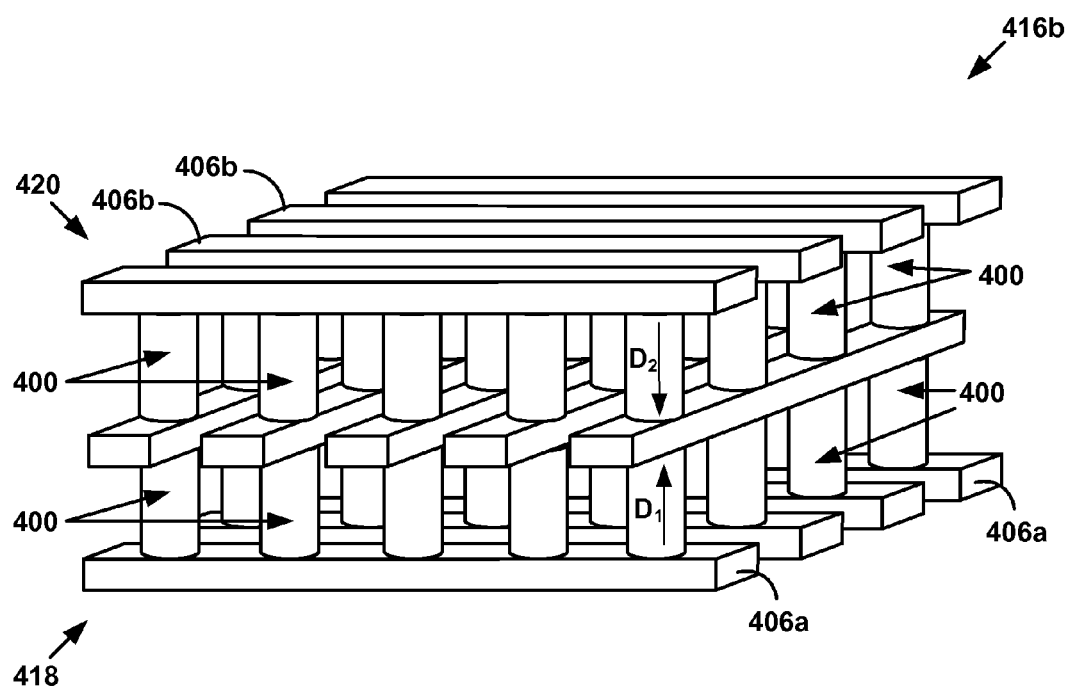
FIG. 4F is a simplified perspective view of a portion of a second monolithic three dimensional memory array that includes a first memory level positioned below a second memory level in accordance with the present invention.

In some embodiments, the memory levels may be formed as described in U.S. Pat. No. 6,952,030, titled "High-Density Three-Dimensional Memory Cell," which is hereby incorporated by reference herein in its entirety for all purposes. For instance, the second (top) conductors of a first memory level may be used as the first (bottom) conductors of a second memory level that is positioned above the first memory level as shown in FIG. 4F. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes. For example, as shown in memory array 416b in FIG. 4F, the diodes of first memory level 418 may be upward pointing diodes as indicated by arrow D1 (e.g., with p regions at the bottom of the diodes), whereas the diodes of second memory level 420 may be downward pointing diodes as indicated by arrow D2 (e.g., with n regions at the bottom of the diodes), or vice versa.

If the MIM stacks 402 are bipolar, in embodiments in which conductors are shared between memory levels as in FIG. 4F, MIM stacks 402 may be arranged to have the same voltage polarity orientation within a memory level, but opposite voltage polarity orientations between adjacent memory levels. For example, the MIM stacks 402 of first memory level 418 may be positively oriented whereas the MIM stacks 402 of the second memory level 420 may be negatively oriented, or vice versa. In some embodiments, the diodes 404 may be oriented to be reversed biased during the set operations of the MIM stacks 402. Alternatively, the diodes 404 may be oriented to be forward biased during the set operations of the MIM stacks 402.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Exemplary Stacked Memory Cells

Figure 5B:
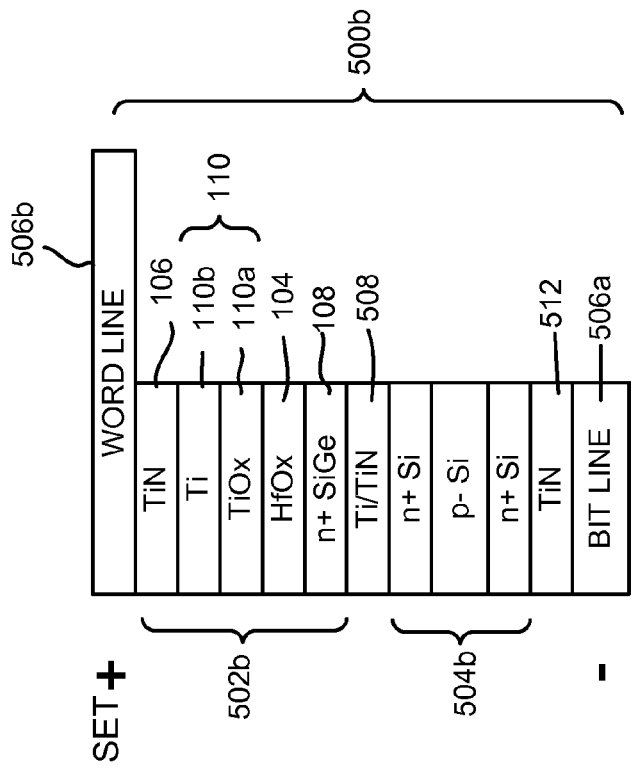
Figure 5A:
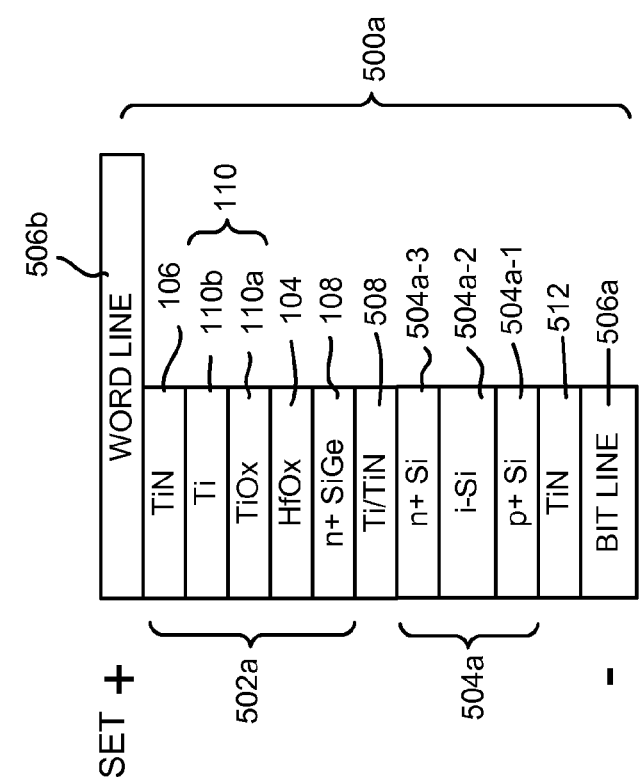

FIG. 5A is a cross sectional view of a first memory cell 500a provided in accordance with the present invention. Additional memory cells (not shown) may be provided at each memory level as described in FIGS. 4D-F.

With reference to FIG. 5A, memory cell 500a includes a MIM stack 502a coupled in series with a diode 504a between bit line 506a and word line 506b. MIM stack 502a has a positive polarity orientation such that a positive voltage applied to word line 506b relative to bit line 506a may be employed to set the MIM stack 502a. Diode 504a is oriented so as to be reversed biased during such a set operation. In other embodiments, diode 504a may be oriented so as to be forward biased while a set operation is performed on the MIM stack 502a.

MIM stack 502a may include any of the MIM stacks previously described, or any other suitable MIM stack. In FIG. 5A, MIM stack 502a is shown as being similar to MIM stack 100d (FIG. 1D).

Diode 504a may include any two terminal, non-linear steering element such as a p-n or p-i-n junction diode, a punch through diode, a tunneling oxide device, a Schottky diode, or the like. In FIG. 5A, diode 504a is shown as being a p-i-n junction diode.

With reference to FIG. 5A, memory cell 500a includes bit line 506a. Bit line 506a may be about 200 to about 2500 angstroms of any suitable conductive material such as tungsten or another appropriate metal, heavily doped semiconductor material, a conductive silicide, a conductive silicide-germanide, a conductive germanide, or the like. In some embodiments, a plurality of bit lines 506a (see for example, FIGS. 4D-F) may be formed as substantially parallel, substantially co-planar bit lines 506a. Exemplary widths for bit lines 506a and/or spacings between bit lines 506a range from about 200 to about 2500 angstroms, although other conductor widths and/or spacings may be used. Bit lines 506a may be separated from one another by dielectric material (not shown) such as silicon dioxide, silicon nitride, silicon oxynitride, low K dielectric, etc., and/or other dielectric materials.

Barrier layer 512 is formed over bit line 506a. Barrier layer 512 may be about 20 to about 500 angstroms, and in some embodiments about 100 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Semiconductor material used to form the diode 504a is formed over barrier layer 512. In the embodiment of FIG. 5A, the diode 504a is formed from a polycrystalline semiconductor material such as polysilicon, a polycrystalline silicon-germanium alloy, polygermanium or any other suitable material. For example, a heavily doped amorphous or polycrystalline p+ silicon layer 504a-1 may be deposited on barrier layer 512. CVD or another suitable process may be employed to deposit p+ silicon layer 504a-1. In at least one embodiment, p+ silicon layer 504a-1 may be formed, for example, from about 100 to about 1000 angstroms, in some embodiments about 100 angstroms, of p+ silicon with a doping concentration of about $10^{21}$ cm$^{-3}$. Other layer thicknesses and/or doping concentrations may be used. P+ silicon layer 504a-1 may be doped in situ, for example, by flowing an acceptor gas during deposition, or ex situ, for example, via implantation.

After deposition of p+ silicon layer 504a-1, a lightly doped, intrinsic and/or unintentionally doped amorphous or polycrystalline silicon layer 504a-2 may be formed over p+ silicon layer 504a-1. CVD or another suitable deposition method may be employed to deposit intrinsic silicon layer 504a-2. In at least one embodiment, intrinsic silicon layer 504a-2 may be about 500 to about 4800 angstroms, in some embodiments about 2500 angstroms, in thickness. Other intrinsic layer thicknesses may be used.

Additional silicon may be deposited and doped by ion implantation or doped in situ during deposition to form an n+ silicon layer 504a-3. Further, in some embodiments, a diffusion process may be employed. In at least one embodiment, the resultant n+ silicon layer 504a-3 may have a thickness of about 100 to about 1000 angstroms, in some embodiments about 100 angstroms, with a doping concentration of about $10^{21}$ cm$^{-3}$. Other layer thicknesses and/or doping concentrations may be used.

Following formation of n+ silicon layer 504a-3, a silicide-forming metal layer stack 508 may be deposited over n+ silicon layer 504a-3. Exemplary silicide-forming metals include sputter or otherwise deposited titanium or cobalt. In some embodiments, a silicide-forming metal layer stack 508 is formed from about 1-4 nanometers of titanium and about 15-25 nanometers of titanium nitride. Other silicide-forming metal layer materials and/or thicknesses may be used.

A rapid thermal anneal ("RTA") step may be performed to form a silicide region by reaction of silicide-forming metal such as Ti with n+ region 504a-3. In some embodiments, the RTA may be performed at about 540° C. for about 1 minute, to cause silicide-forming metal and the deposited silicon of diode 504a to interact to form a silicide layer, consuming all or a portion of the silicide-forming metal.

In other embodiments, a silicide layer may be formed by sputtering a silicide target or by co-sputtering silicide forming metal and silicon.

As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., a silicide layer may enhance the crystalline structure of silicon diode 504a during annealing). Lower resistivity silicon thereby is provided. Similar results may be achieved for silicon-germanium alloy and/or germanium diodes.

Following formation of metal layer stack 508, bottom electrode 108 of MIM stack 502a may be formed. In some embodiments, bottom electrode 108 may include a layer of SiGe alloy having, for example, between about 5 to about 35 atm % Ge and an n+ doping concentration of about $5 \times 10^{19}$-$5 \times 10^{21}$ atoms/cm$^3$, and in some embodiments about $2 \times 10^{20}$ atoms/cm$^3$. As stated, SiGe bottom electrodes with about 5-35 atm % Ge significantly reduce crystalline anneal temperatures while still providing ample Si for oxygen vacancy formation. In some embodiments, low temperature processes such as low pressure chemical vapor deposition (LPCVD) or plasma enhanced chemical vapor deposition (PECVD) may be employed to form the SiGe bottom electrode 108. Exemplary temperature ranges at which the SiGe bottom electrode 108 may be formed (crystallized) are 600° C. or less, and in some embodiments 550° C. or less. Exemplary thicknesses for the SiGe bottom electrode 108 range from about 2 to 100 nanometers. Other atm % of Ge, doping types, doping levels, formation temperatures and/or layer thicknesses may be used in other embodiments.

Following formation of the bottom electrode 108, RRS material 104 may be formed by atomic layer deposition (ALD) or another suitable method. For example, the RRS material 104 may include HfO$_X$, ZrO$_X$, NiO$_X$, TiO$_X$, TaO$_X$, NbO$_X$, Al$_X$O$_Y$, combinations of one or more of these metal oxides, or another suitable switching material. In the embodiment of FIG. 5A, the RRS material 104 may include HfO$_X$ having a thickness of about 3-12 nanometers, and in some embodiments about 5 nanometers, with x being about 1.2-2.0 and in some embodiments about 1.7. Other thickness ranges and/or x values may be used.

Following formation of the RRS material 104, a metal/metal oxide layer stack 110 may be formed. The metal/metal oxide layer stack 110 may include, for example, Ti/TiO$_X$, Zr/ZrO$_X$, Ni/NiO$_X$, Al/Al$_X$O$_Y$, Ta/TaO$_X$, Nb/NbO$_X$, Hf/HfO$_X$ or another similar layer stack. In the embodiment shown, the metal/metal oxide layer stack 110 may include Ti layer 110b having a thickness of about 0.5-10 nanometers, and in some embodiments about 2 nanometers and TiO$_X$ layer 110a having a thickness of about 0.5-6 nanometers, and in some embodiments about 1 nanometer; and x may be about 1.2-2.0 and in some embodiments about 1.5. Other thicknesses and/or x values may be used.

The TiO$_X$ layer 110a may be formed, for example, by depositing a layer of Ti over the HfO$_X$ layer 104 and then oxidizing the Ti to form the TiO$_X$ layer 110a. For example, a layer of Ti may be deposited via PVD and then oxidized in the same ALD chamber used to form the HfO$_X$ layer 104 (e.g., by not flowing the Hf precursor). The Ti layer 110b may then be formed over the TiO$_X$ layer 110a.

Top electrode 106 is formed over Ti layer 110b. For example, top electrode 106 may include titanium nitride, tantalum nitride, tungsten nitride, combinations of the same, a metal/metal nitride stack such as Ti/TiN, Ta/TaN, W/WN or another similar barrier layer. In the embodiment shown, the top electrode 106 may include about 10-60 nanometers, and in some embodiments about 20 nanometers of TiN. Other layer thicknesses may be used. In some embodiments, n+ SiGe layer 108, HfO$_X$ layer 104, TiO$_X$ layer 110a, Ti Layer 110b and/or TiN layer 106 may be formed in a single cluster tool (e.g., without breaking vacuum) to improve the interfaces between the various layers.

To etch the above described MIM stack and diode layers into a pillar structure 514 (as shown in FIGS. 4B-4F), any suitable etch process may be used. In some embodiments, a hard mask process may be employed as follows:

(1) deposit a metal hard mask over the top TiN electrode 106, such as about 500-1000 angstroms of W;
(2) deposit an oxide hard mask over the metal hard mask, such as about 1000-2000 angstroms of Si$_X$O$_Y$;
(3) deposit a polysilicon hard mask over the oxide hard mask, such as about 500-2000 angstroms of polysilicon; and
(4) deposit photoresist over the polysilicon hard mask, such as about 1000-3000 angstroms of photoresist.

The photoresist layer then may be exposed and developed, and the polysilicon hard mask layer may be etched using, for example, HBr, Cl$_2$, O$_2$, and/or He in a suitable high-density plasma etch chamber. Following stripping (asking) of the photoresist, the oxide hard mask may be etched through the patterned and etched polysilicon hard mask using, for example, $C_4F_6$, $O_2$, and Ar in a suitable medium-density plasma etch chamber. The metal hard mask may then be etched through the patterned and etched oxide hard mask using, for example, $NF_3$, Ar, $N_2$, $Cl_2$, He, and/or $O_2$ in a suitable high-density plasma etch chamber.

Thereafter, the TiN top electrode 106 may be etched using, for example, HBr, $Cl_2$, and/or He; the Ti/TiO$_x$ metal layer stack 110 may be etched using, for example, $CF_4$, $Cl_2$, He, and/or $N_2$; the HfO$_x$ RRS material 104 may be etched using, for example, HBr, $Cl_2$, He, and/or $N_2$; the n+ SiGe bottom electrode 108 may be etched using, for example, HBr, $Cl_2$, He, $O_2$ and/or $N_2$; the Ti/TiN layer stack 508 may be etched using, for example, HBr, $Cl_2$, and/or He; the polysilicon diode 504a may be etched using, for example, HBr, $Cl_2$, He, $O_2$ and/or $N_2$; and the TiN layer 512 may be etched using, for example, HBr, $Cl_2$, and/or He. All of these etch processes may be performed, for example, in a suitable high-density plasma etch chamber. Other etch chemistries and/or processes may be employed.

The resulting pillar structure 514 may be surrounded by a suitable dielectric to isolate it from other similar pillar structures (not shown) on the same memory level. For example, approximately 200-7000 angstroms of silicon dioxide may be deposited and planarized using chemical mechanical polishing or an etchback process to remove excess dielectric material and form a planar surface for receiving word line 506b. Additionally, a thin silicon nitride liner, such as about 50 to 200 angstroms, may be deposited prior to silicon dioxide deposition.

Word line 506b may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. For example, conductive material may be deposited and etched to form word line 506b (and other word lines not separately shown). In at least one embodiment, such word lines are substantially parallel, substantially coplanar conductors that extend in a different direction than bit line(s) 506a (as shown in FIG. 4F, for example).

Word line 506b may be isolated from other word lines via a suitable dielectric fill and etchback process. Thereafter, an additional memory cell (not shown) may be formed over the word line 506b in a manner similar to that used to form the memory cell 500a.

Following formation of the memory cell 500a (and/or any additional memory cell layers/levels to be formed above memory cell stack 500a), the resultant structure may be annealed to crystallize the deposited semiconductor material of diode 504a (and/or to form silicide regions by reaction of silicide-forming metal from layer 508 with silicon region(s) of the diode 504a). As stated, the lattice spacing of titanium silicide and cobalt silicide are close to that of silicon, and it appears that silicide layers may serve as "crystallization templates" or "seeds" for adjacent deposited silicon as the deposited silicon crystallizes (e.g., a silicide layer may enhance the crystalline structure of silicon diodes during annealing at temperatures of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and in some embodiments between about 650 and 750° C. Other annealing times, temperatures and/or environments may be used.

FIG. 5B is a cross sectional view of a second memory cell 500b provided in accordance with the present invention. The second memory cell 500b of FIG. 5B is similar to the first memory cell 500a of FIG. 5A, but employs a unipolar steering element in place of the bipolar steering element employed by the first memory cell 500a. For example, the diode 504b in FIG. 5B is a punch through diode rather than a p-i-n junction diode as is used in the memory cell 500a of FIG. 5A. As stated, other steering elements may be used such as tunneling devices, Schottky diodes or the like.

FIG. 5C is a cross sectional view of a third memory cell 500c provided in accordance with the present invention. The third memory cell 500c of FIG. 5C is similar to the first memory cell 500a of FIG. 5A (and may be similarly formed), but employs a bi-layer metal-silicide bottom electrode 108 (as described previously with reference to FIGS. 2A-2D).

FIG. 5D is a cross sectional view of a fourth memory cell 500d provided in accordance with the present invention. The fourth memory cell 500d of FIG. 5D is similar to the third memory cell 500c of FIG. 5C, but employs a unipolar steering element in place of the bipolar steering element employed by the third memory cell 500c. For example, the diode 504d in FIG. 5D is a punch through diode rather than a p-i-n junction diode as is used in the memory cell 500c of FIG. 5C. As stated, other steering elements may be used such as tunneling devices, Schottky diodes or the like.

FIG. 5E is a cross sectional view of a fifth memory cell 500e provided in accordance with the present invention. The fifth memory cell 500e of FIG. 5E is similar to the first memory cell 500a of FIG. 5A (and may be similarly formed), but employs a metal-silicide bi-layer with an additional metal, metal nitride or metal oxide layer 112 for the bottom electrode (as described previously with reference to FIGS. 2E-2H).

FIG. 5F is a cross sectional view of a sixth memory cell 500f provided in accordance with the present invention. The sixth memory cell 500f of FIG. 5F is similar to the fifth memory cell 500e of FIG. 5E, but employs a unipolar steering element in place of the bipolar steering element employed by the fifth memory cell 500e. For example, the diode 504f in FIG. 5F is a punch through diode rather than a p-i-n junction diode as is used in the memory cell 500e of FIG. 5E. As stated, other steering elements may be used such as tunneling devices, Schottky diodes or the like.

FIG. 5G is a cross sectional view of a seventh memory cell 500g provided in accordance with the present invention. The seventh memory cell 500g of FIG. 5G is similar to the first memory cell 500a of FIG. 5A (and may be similarly formed), but employs a metal, metal nitride or metal oxide layer for the bottom electrode 108 (as described previously with reference to FIGS. 3A-3D).

FIG. 5H is a cross sectional view of an eighth memory cell 500h provided in accordance with the present invention. The eighth memory cell 500h of FIG. 5H is similar to the seventh memory cell 500g of FIG. 5G, but employs a unipolar steering element in place of the bipolar steering element employed by the seventh memory cell 500g. For example, the diode 504h in FIG. 5H is a punch through diode rather than a p-i-n junction diode as is used in the memory cell 500g of FIG. 5G. As stated, other steering elements may be used such as tunneling devices, Schottky diodes or the like.

The foregoing description discloses only exemplary embodiments of the invention. Modifications of the above disclosed apparatus and methods which fall within the scope of the invention will be readily apparent to those of ordinary skill in the art. For instance, MIM stacks may be placed above or below steering elements within any memory cells.

Accordingly, although the present invention has been disclosed in connection with exemplary embodiments thereof, it should be understood that other embodiments may fall within the spirit and scope of the invention, as defined by the following claims.

The invention claimed is:

1. A device comprising:
   a metal-insulator-metal (MIM) stack comprising:
      a first conductive layer comprising a silicon-germanium (SiGe) alloy;
      a resistivity-switching layer comprising a metal oxide layer formed above the first conductive layer; and
      a second conductive layer formed above the resistivity-switching layer; and
   a diode coupled to and disposed above or below the MIM stack.

2. The device of claim 1 wherein the SiGe alloy comprises between about 5 and 35 atm % Ge.

3. The device of claim 1 wherein the first conductive layer has a thickness of about 2-100 nanometers.

4. The device of claim 1 wherein the metal oxide layer comprises one or more of $HfO_X$, $ZrO_X$, $NiO_X$, $TiO_X$, $TaO_X$, $NbO_X$ or $Al_XO_Y$.

5. The device of claim 1 wherein the second conductive layer comprises titanium nitride.

6. The device of claim 5 wherein the second conductive layer comprises a layer stack having at least one of a titanium layer and a titanium oxide layer formed over the resistivity-switching layer and a titanium nitride layer formed thereover.

7. A memory cell comprising:
   the device of claim 1.

8. The memory cell of claim 7 wherein the diode comprises a vertical polysilicon diode coupled in series with the MIM stack.

9. The memory cell of claim 7 wherein the SiGe alloy comprises between about 5 and 35 atm % Ge.

10. The memory cell of claim 7 wherein the first conductive layer has a thickness of about 2-100 nanometers.

11. The memory cell of claim 7 wherein the metal oxide layer comprises one or more of $HfO_X$, $ZrO_X$, $NiO_X$, $TiO_X$, $TaO_X$, $NbO_X$ or $Al_XO_Y$.

12. The memory cell of claim 7 wherein the second conductive layer comprises a layer stack having at least one of a titanium layer and a titanium oxide layer formed over the resistivity-switching layer and a titanium nitride layer formed thereover.

13. A method of forming a device, the method comprising:
   forming a metal-insulator-metal (MIM) stack comprising:
      forming a first conductive layer comprising a silicon-germanium (SiGe) alloy;
      forming a resistivity-switching layer comprising a metal oxide layer above the first conductive layer; and
      forming a second conductive layer above the resistivity-switching layer; and
   forming a diode coupled to and disposed above or below the MIM stack.

14. The method of claim 13 wherein the first conductive layer is formed at a temperature of not more than about 600° C.

15. The method of claim 13 wherein the first conductive layer is formed at a temperature of not more than about 550° C.

16. The method of claim 13 wherein the first conductive layer is formed using low-pressure chemical vapor deposition or plasma-enhanced chemical vapor deposition.

17. The method of claim 13 wherein the SiGe alloy comprises between about 5 and 35 atm % Ge.

18. The method of claim 13 wherein the second conductive layer comprises a layer stack having at least one of a titanium layer and a titanium oxide layer formed over the resistivity-switching layer and a titanium nitride layer formed thereover.

19. The method of claim 13 wherein the metal oxide layer comprises one or more of $HfO_X$, $ZrO_X$, $NiO_X$, $TiO_X$, $TaO_X$, $NbO_X$ or $Al_XO_Y$.

20. A method of forming a memory cell comprising:
   forming a metal-insulator-metal (MIM) stack having:
      a first conductive layer comprising a silicon-germanium (SiGe) alloy;
      a resistivity-switching layer comprising a metal oxide layer formed above the first conductive layer; and
      a second conductive layer formed above the resistivity-switching layer; and
   forming a steering element coupled to and disposed above or below the MIM stack.

21. The method of claim 20 wherein the first conductive layer is formed at a temperature of not more than about 600° C.

22. The method of claim 20 wherein the first conductive layer is formed at a temperature of not more than about 550° C.

23. The method of claim 20 wherein the first conductive layer is formed using low-pressure chemical vapor deposition or plasma-enhanced chemical vapor deposition.

24. The method of claim 20 wherein the SiGe alloy comprises between about 5 and 35 atm % Ge.

25. The method of claim 20 wherein the metal oxide layer comprises one or more of $HfO_X$, $ZrO_X$, $NiO_X$, $TiO_X$, $TaO_X$, $NbO_X$ or $Al_XO_Y$.